United States Patent
Herbschleb et al.

(10) Patent No.: US 11,808,831 B2
(45) Date of Patent: Nov. 7, 2023

(54) MEASUREMENT APPARATUS AND MEASUREMENT METHOD

(71) Applicants: SUMIDA CORPORATION, Tokyo (JP); Kyoto University, Kyoto (JP)

(72) Inventors: David Ernst Herbschleb, Kyoto (JP); Norikazu Mizuochi, Kyoto (JP); Yoshiharu Yoshii, Natori (JP)

(73) Assignees: SUMIDA CORPORATION; Kyoto University

( * ) Notice: Subject to any disclaimer, the term of this patent is extended or adjusted under 35 U.S.C. 154(b) by 0 days.

(21) Appl. No.: 17/773,530

(22) PCT Filed: Dec. 17, 2020

(86) PCT No.: PCT/JP2020/047122
§ 371 (c)(1),
(2) Date: Apr. 29, 2022

(87) PCT Pub. No.: WO2021/132009
PCT Pub. Date: Jul. 1, 2021

(65) Prior Publication Data
US 2022/0373628 A1    Nov. 24, 2022

(30) Foreign Application Priority Data
Dec. 24, 2019    (JP) ................................ 2019-233583

(51) Int. Cl.
*G01R 33/54*    (2006.01)
*G01R 33/56*    (2006.01)

(52) U.S. Cl.
CPC ....... *G01R 33/543* (2013.01); *G01R 33/5608* (2013.01)

(58) Field of Classification Search
None
See application file for complete search history.

(56) References Cited

U.S. PATENT DOCUMENTS 10,408,890 B2 *   9/2019   Bruce .................. G01R 33/032
10,459,041 B2 * 10/2019   Hahn ................... G01R 33/032
(Continued)

FOREIGN PATENT DOCUMENTS

JP    2012-110489    6/2012

*Primary Examiner* — Rodney E Fuller

(57) ABSTRACT

The magnetic resonance member 1 is a member that is arranged in a measurement target AC physical field, and in which a quantum operation can be performed in a specific quantum system. The coil 2 and the high frequency power supply 3 apply a magnetic field of a microwave to the magnetic resonance member 1. The irradiating device 4 irradiates the magnetic resonance member 1 with light, and the detecting device 5 detects from the magnetic resonance member 1 a physical phenomenon corresponding to the measurement target AC physical field. Further, the measurement control unit 21 performs the DC physical field measurement sequence a predetermined plural times, and in each of the plural times of the DC physical field measurement sequence, determines a detection value of the physical phenomenon detected by the detecting device 5. The calculation unit 22 calculates a measurement result for a specific time span of the measurement target AC physical field on the basis of the detection values corresponding to the plural times of the DC physical field measurement sequence.

3 Claims, 3 Drawing Sheets

(56) References Cited

U.S. PATENT DOCUMENTS

| | | | | |
|---|---|---|---|---|
| 10,520,558 B2* | 12/2019 | Hahn | ................... | G01R 33/032 |
| 10,969,445 B2* | 4/2021 | Yoshii | ................. | G01R 33/032 |
| 2017/0343695 A1* | 11/2017 | Stetson | ............... | G01R 33/032 |
| 2018/0136291 A1* | 5/2018 | Pham | ..................... | G01R 33/24 |
| 2020/0132785 A1* | 4/2020 | Yoshii | .................... | G01R 33/02 |
| 2020/0271735 A1* | 8/2020 | Takemura | .............. | G01R 33/36 |

* cited by examiner

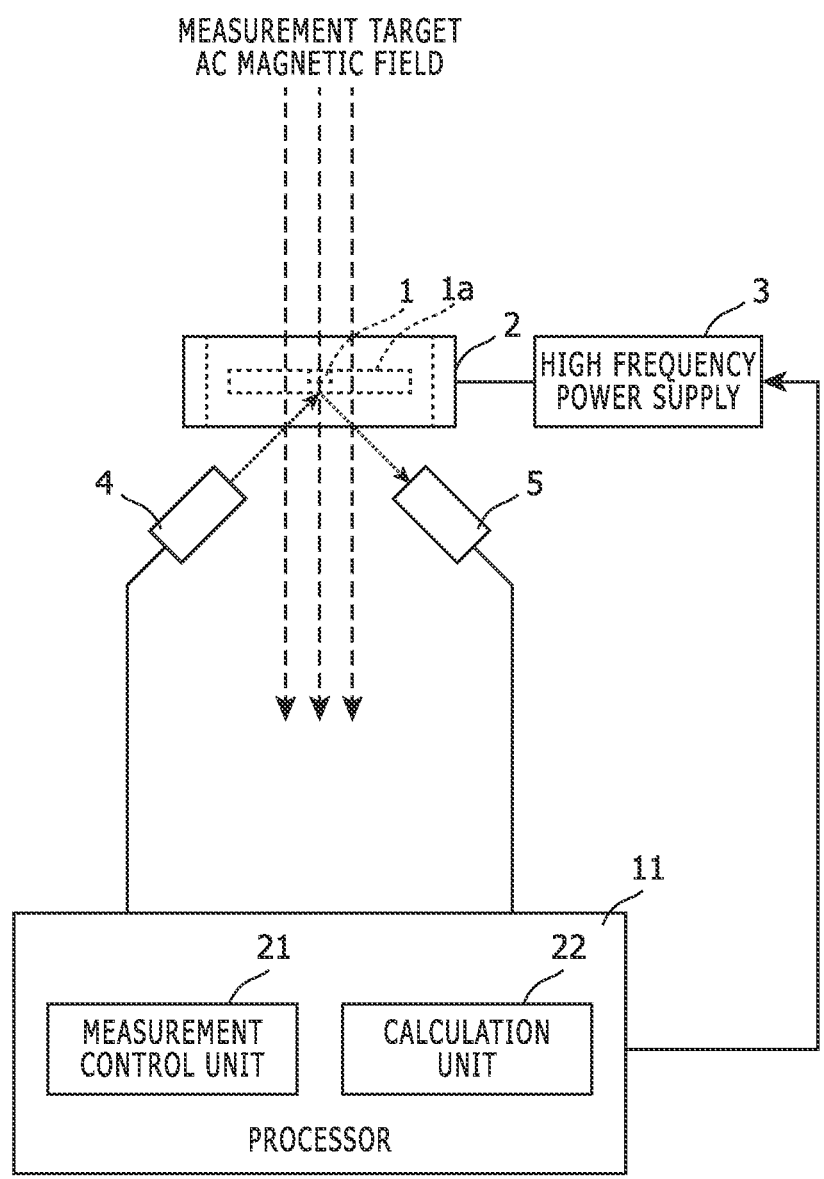

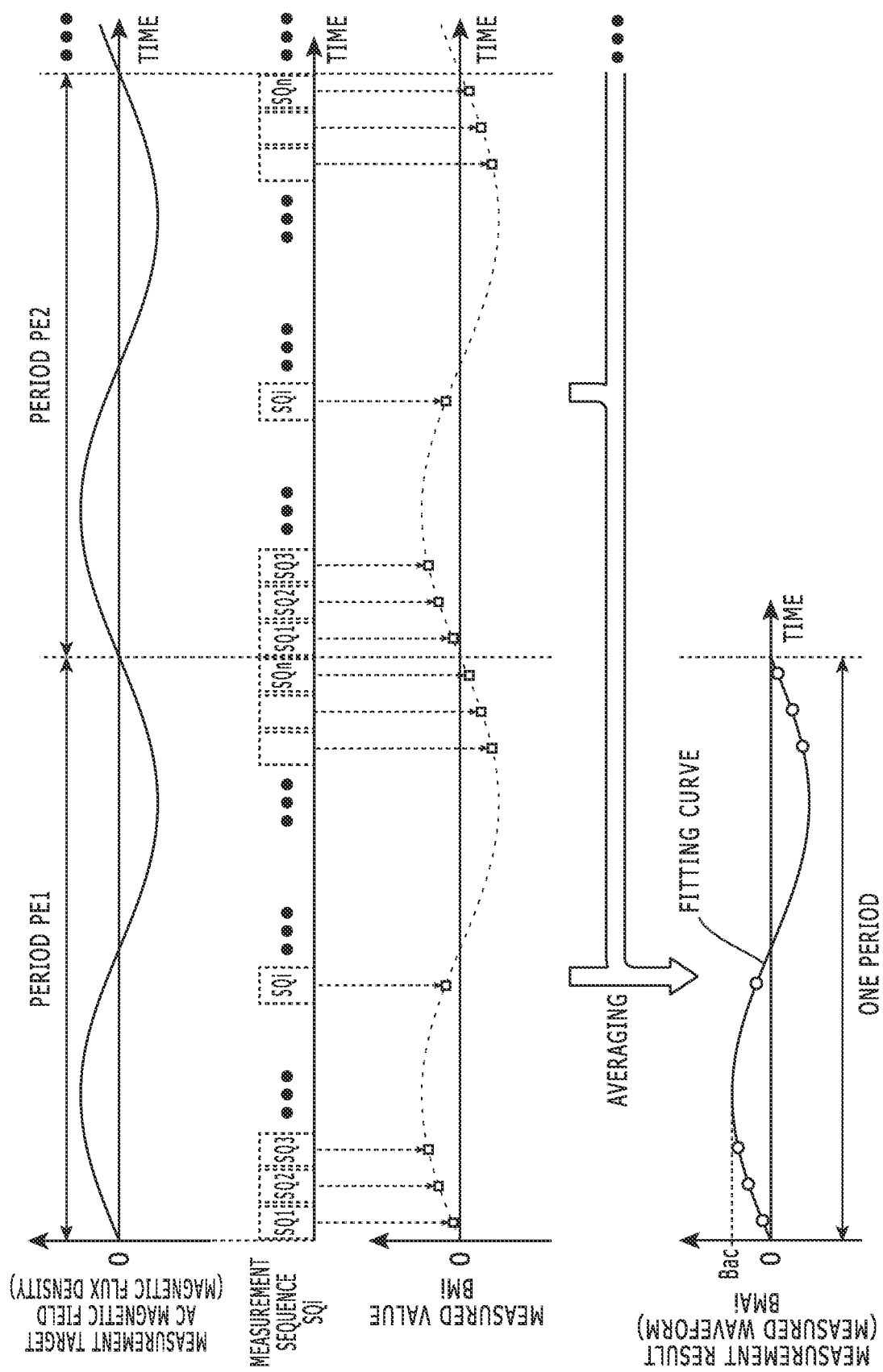

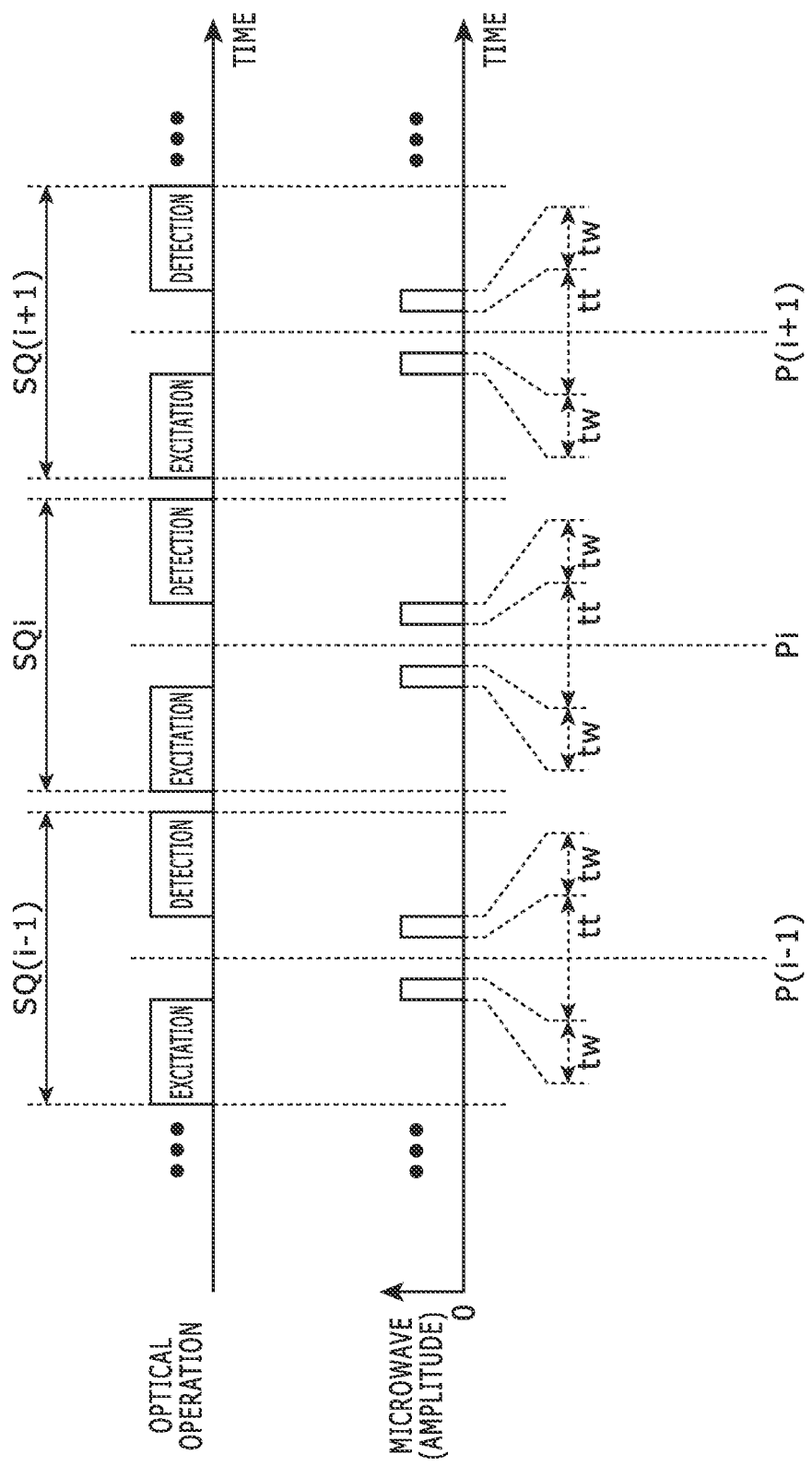

MEASUREMENT APPARATUS AND MEASUREMENT METHOD

TECHNICAL FIELD

The present invention relates to a measurement apparatus and a measurement method.

BACKGROUND ART

A magnetic measurement apparatus performs magnetic measurement with ODMR (Optically Detected Magnetic Resonance) that uses electron spin resonance (See Patent Literature #1, for example).

In ODMR, a medium has spin sublevels and optical transition energy levels, and the medium is simultaneously irradiated with a high-frequency magnetic field (microwave) and light for excitation between the spin sublevels and excitation between the optical transition energy levels, and thereby a population change or the like due to magnetic resonance between the spin sublevels is detected as an optical signal with high sensitivity. In general, after an electron in a ground state is excited with green light, the electron emits red light when returning the ground state. For example, in a nitrogen and a lattice defect in a diamond structure (NVC: Nitrogen Vacancy Center), when an electron is irradiated with a high-frequency magnetic field of about 2.87 GHz after initialization with the optical excitation, the electron moves from the lowest level (ms=0) among three spin sublevels of the ground state to an energy level (ms=+1 or −1) higher than the lowest level among the three spin sublevels. When the electron in such state is irradiated with green light, an emitting light intensity is decreased because of no radiation transition to the lowest level (ms=0) among the three sublevels of the ground level; and therefore, it can be determined by detecting this light whether magnetic resonance occurs due to the high-frequency magnetic field. As mentioned, ODMR uses optically detected magnetic resonance material such as NVC.

A measurement method of a DC (Direct Current) magnetic field using an NVC is performed in accordance with Ramsey Pulse Sequence. In Ramsey Pulse Sequence, (a) an NVC is irradiated with excitation light, (b) a first pi/2 pulse of a microwave is applied to the NVC, (c) a second pi/2 pulse of a microwave is applied to the NVC with a predetermined time interval tt from the first pi/2 pulse, (d) the NVC is irradiated with measurement light, and an emitted light intensity of the NVC is measured, and (e) a magnetic flux density is estimated on the basis of the measured intensity.

Further, a measurement method of an AC (Alternating Current) magnetic field using an NVC is performed in accordance with Spin Echo Pulse Sequence. In Spin Echo Pulse Sequence, (a) an NVC is irradiated with excitation light, (b) a first pi/2 pulse of a microwave is applied to the NVC at the 0-degree phase of a measurement target magnetic field, (c) a pi pulse of a microwave is applied to the NVC at the 180-degree phase of the measurement target magnetic field, (d) a second pi/2 pulse of a microwave is applied to the NVC at the 360-degree phase of the measurement target magnetic field, (e) the NVC is irradiated with measurement light, and an emitted light intensity of the NVC is measured, and (f) a magnetic flux density is estimated on the basis of the measured intensity of the light.

As mentioned, in Ramsey Pulse Sequence and Spin Echo Pulse Sequence, a measurement target magnetic field is estimated using an electron spin quantum operation based on Rabi oscillation in a color center.

CITATION LIST

Patent Literature

PATENT LITERATURE #1: Japan Patent Application Publication No. 2012-110489.

SUMMARY OF INVENTION

However, in Spin Echo Pulse Sequence, if time intervals between the first pi/2 pulse and the pi pulse and between the pi pulse and the second pi/2 pulse get longer than a spin coherence time that keeps information on a measurement target magnetic field, then such information of the measurement target magnetic field disappears, and therefore, accurate measurement is hardly performed for a long period physical field such as AC magnetic field.

The present invention aims to obtain a measurement apparatus and a measurement method that accurately measure a long period physical field using a quantum operation in a specific quantum system.

A measurement apparatus according to the present invention includes: a magnetic resonance member arranged in a measurement target AC physical field, and in which a quantum operation can be performed in a specific quantum system; a coil that applies a magnetic field of a microwave to the magnetic resonance member; a high frequency power supply that causes the coil to conduct a current of the microwave; an irradiating device that irradiates the magnetic resonance member with light in a DC physical field measurement sequence; a detecting device that detects from the magnetic resonance member a physical phenomenon corresponding to the measurement target AC physical field in the DC physical field measurement sequence; a measurement control unit that performs the DC physical field measurement sequence a predetermined plural times, and in each of the plural times of the DC physical field measurement sequence, (a) controls the high frequency power supply and the irradiating device, and (b) determines a detection value of the physical phenomenon detected by the detecting device; and a calculation unit that calculates a measurement result for a specific time span of the measurement target AC physical field on the basis of the detection values corresponding to the plural times of the DC physical field measurement sequence.

A measurement method according to the present invention includes the steps of: (a) performing a DC physical field measurement sequence a predetermined plural times, and in each of the plural times of the DC physical field measurement sequence, detecting a physical phenomenon corresponding to a measurement target AC physical field, and determining a detection value of the physical phenomenon; and (b) calculating a measurement result for a specific time span of the measurement target AC physical field on the basis of the detection values corresponding to the plural times of the DC physical field measurement sequence. Further, the DC physical field measurement sequence is performed using a magnetic resonance member arranged in the measurement target AC physical field, and in which a quantum operation can be performed in a specific quantum system; a coil that applies a magnetic field of a microwave to the magnetic resonance member; a high frequency power supply that causes the coil to conduct a current of the microwave; an irradiating device that irradiates the magnetic resonance member with light in a DC physical field measurement sequence; and a detecting device that detects from the magnetic resonance member a physical phenomenon corresponding to the measurement target AC physical field in the DC physical field measurement sequence.

Advantageous Effect of Invention

By means of the present invention, obtained are a measurement apparatus and a measurement method that accurately measure a long period physical field using a quantum operation in a specific quantum system in a magnetic resonance member.

BRIEF DESCRIPTION OF DRAWINGS

FIG. 1 shows a diagram that indicates a configuration of a measurement apparatus according to an embodiment of the present invention;

FIG. 2 shows a timing chart that explains a behavior of the measurement apparatus shown in FIG. 1; and FIG. 3 shows a timing chart that explains a measurement sequence shown in FIG. 2.

DESCRIPTION OF EMBODIMENTS

Hereinafter, an embodiment according to aspects of the present invention will be explained with reference to a drawing.

FIG. 1 shows a diagram that indicates a configuration of a measurement apparatus according to an embodiment of the present invention. FIG. 2 shows a timing chart that explains a behavior of the measurement apparatus shown in FIG. 1. The magnetic field measurement apparatus shown in FIG. 1 includes a magnetic resonance member 1. The magnetic resonance member 1 is a member that is arranged in a measurement target AC physical field, and in which a quantum operation can be performed in a specific quantum system; and here, includes a color center of which an electron spin quantum operation can be performed. The magnetic resonance member 1 may include the only one color center or may include the plural color centers (i.e. an ensemble of the color centers). In this embodiment, the quantum system is an electron spin, in which a quantum operation based on Rabi oscillation can be performed. It should be noted that instead of such electron spin, as the quantum system, a nuclear spin, a flux quantum bit or the like may be used. In such a case, as the magnetic resonance member 1, a member including a nuclear spin in which a quantum operation can be performed, or a member that can form a flux quantum bit. Further, in this embodiment, the measurement target AC physical field is an AC magnetic field having a specific period, but may be another physical field (such as electric field or temperature field) alternating with a specific period. The measurement target AC physical field may be an AC physical field having a single frequency or may be an AC physical field having plural frequency components.

Further, in this embodiment, as the magnetic resonance member 1, an ODMR member is used, and in the magnetic resonance member 1, a physical phenomenon corresponding to the measurement target AC physical field (in case of an ODMR member, emitting fluorescence) is optically detected. This physical phenomenon may be a change of an electric characteristic (e.g. a change of a resistance value of the magnetic resonance member 1), and may be electrically detected.

Here, the ODMR member used as the magnetic resonance member 1 is a board member such as a diamond including an NVC, and is fixed to a support board 1a.

Further, the measurement apparatus shown in FIG. 1 includes a coil 2, a high frequency power supply 3, an irradiating device 4, and a detecting device 5.

The coil 2 applies a magnetic field of a microwave to the magnetic resonance member 1. A frequency of the microwave is set in accordance with a type of the ODMR member 1. For example, if the magnetic resonance member 1 is a diamond including an NVC, the coil 2 applies a microwave magnetic field of about 2.87 GHz. The high frequency power supply 3 causes the coil 2 to conduct a current of a microwave (i.e. a current to generate the aforementioned microwave magnetic field).

In a DC physical field measurement sequence, the irradiating device 4 irradiates the magnetic resonance member 1 with light (in this embodiment, excitation light with a specific wavelength and measurement light with a specific wavelength). In the DC physical field measurement sequence, the detecting device 5 detects from the magnetic resonance member 1 a physical phenomenon corresponding to the measurement target physical field.

In this embodiment, the detecting device 5 is a light receiving device that detects fluorescence emitted from the magnetic resonance member 1 (i.e. the aforementioned physical phenomenon) when the magnetic resonance member 1 is irradiated with the measurement light. The detecting device 5 may include an electrode pair arranged to the magnetic resonance member 1, and may measure a value of electric current that flows in the magnetic resonance member 1 between the electrode pair, and thereby detect a resistance value (i.e. the aforementioned physical phenomenon) of the magnetic resonance member 1 because the resistance value changes correspondingly to the measurement target AC physical field.

Further, the measurement apparatus shown in FIG. 1 includes a processor 11. The processor 11 includes a computer, for example, and executes a program with the computer and thereby acts as sorts of processing units. In this embodiment, the processor 11 acts as a measurement control unit 21 and a calculation unit 22.

The measurement control unit 21, for example, as shown in FIG. 2, performs the DC physical field measurement sequence SQi a predetermined plural times (in a specific time span within one period) every one period PEj of the measurement target AC physical field (here, a measurement target AC magnetic field), and in each of the DC physical field measurement sequences SQ1, . . . , SQn, (a) controls the high frequency power supply 3 and the irradiating device 4, and (b) determines a detection value of the physical phenomenon detected by the detecting device 5. It should be noted that in FIG. 2 a series of the DC physical field measurement sequences SQ1, . . . , SQn is started at a zero phase of the measurement target AC physical field; and alternatively, a series of the DC physical field measurement sequences SQ1, . . . , SQn may be started at any unknown phase.

In this embodiment, a time length of each DC physical field measurement sequence SQi and a time interval between the DC physical field measurement sequences are constant. In addition, the time interval between the DC physical field measurement sequences may be zero or may be a specific time length other than zero.

For example, the irradiating device 4 includes a laser diode or the like as a light source, and the detecting device 5 includes a photo diode or the like as a photodetector, and the measurement control unit 21 determines as the aforementioned detection value a detection light intensity of the aforementioned fluorescence on the basis of an output signal of the detecting device 5, and this output signal is obtained by amplification and/or the like of an output signal of the photodetector.

FIG. 3 shows a timing chart that explains a measurement sequence shown in FIG. 2.

In this embodiment, as the aforementioned predetermined DC physical field measurement sequence SQi, Ramsey Pulse Sequence is applied as shown in FIG. 3, for example. However, the DC magnetic field measurement sequence is not limited to it.

In this embodiment, Ramsey Pulse Sequence is used as the aforementioned DC physical field measurement sequence, and therefore, the DC physical field measurement sequence includes two pi/2 pulses of the aforementioned microwave; and the physical phenomenon corresponds to a phase change of an electron spin of the color center (here, NVC) in Rabi oscillation, due to a free precession motion during a time interval tt between the two pi/2 pluses. Further, the time interval tt between the two pi/2 pluses (a) may be set correspondingly to an effective transverse relaxation time (free induction decay time) $T_2^*$ of the magnetic resonance member 1, and (b) may be set such that a frequency of the measurement target AC physical field is included in an effective-sensitivity frequency range (i.e. a range equal to or less than an upper limit frequency f corresponding to the time interval tt) obtained by this time interval tt.

If the aforementioned time interval tt is substantially equal to a half of the effective transverse relaxation time (free induction decay time) $T_2^*$, the measurement sequence SQi has a favorable sensitivity. It should be noted that the effective transverse relaxation time (free induction decay time) $T_2^*$ takes a unique value to a color center used in this measurement. In addition, if the measurement target AC physical field has a low frequency (i.e. a period of a long time length), then the number of the measurement sequences SQi per period or the time interval between the measurement sequences SQi is changed.

Here, the sensitivity H is expressed as a product of dBmin (the minimum detectable value of the magnetic field) and a square root of the measurement time Tm. Further, dBmin depends on $T_2^*$, the number of NV centers in the observation, and the like. In this embodiment, the aforementioned DC physical field measurement sequence SQi is Ramsey Pulse Sequence, and consequently, in a measurable frequency range, the sensitivity H is substantially constant regardless of a frequency of the measurement target AC magnetic field. Specifically, the lower frequency a frequency component has in the measurement target magnetic field, the longer the measurement time per period gets, and the larger the number of the measured values per the specific time span (here, one period) are; and therefore, the sensitivity is substantially constant. In addition, when increasing the number of the measured values per the specific time span, the number of the measured values used in curve fitting mentioned below gets large, and consequently, a more accurate fitting curve is obtained.

The calculation unit 22 calculates a measurement result of the measurement target AC physical field on the basis of the detection values corresponding to the aforementioned plural times of the DC physical field measurement sequence SQi.

In this embodiment, as shown in FIG. 2, for example, the calculation unit 22 (a) calculates measured values BMi for one period of the measurement target AC physical field on the basis of the detection values corresponding to the DC physical field measurement sequences SQ1 to SQn of the aforementioned plural (n) times in each of plural periods of the measurement target AC physical field, and (b) calculates averages of the measured values for one period of plural sets of which the number is same as the number of the plural periods; and thereby decreases noise in the measured values for one period. Specifically, due to this averaging, a frequency component other than a frequency that is an inverse number of this one period (and other than frequencies as integral multiplications of this frequency) is lowered, and consequently, randomly-appearing high frequency noise is lowered. In addition, if a frequency component as the integral multiplication appears at random phases, then this frequency component is also lowered. For example, in case of Schottky noise, such time-wise averaging is effective on reduction of the noise, and if the magnetic resonance member 1 includes ensemble, the detection value spatially averaged is obtained and it is effective on reduction of the noise.

For example, if the measured values of the j th period among m periods is expressed as BM1(j), . . . , BMn(j), then [an average value of BM1(1) to BM1(m)], . . . , [an average value of BMn(1) to BMn(m)] are derived as the averaged measurement result.

Specifically, in this embodiment, the calculation unit 22 calculates the measured values BMi (i=1, n) of intensities during one period of the measurement target AC magnetic field, on the basis of the detection values of the aforementioned fluorescence obtained by the detecting device 5.

For example, the calculation unit 22 calculates a magnetic flux density from the detection values of the aforementioned fluorescence in accordance with the following formula.

$$Si=[(a+b)/2]+[(a-b)/2]*\cos(\mathrm{Gamma}*BMi*tt)$$

Here, Si is a detection value of the fluorescence at the i th measurement sequence SQi (i.e. a corresponding phase i) in one period, BMi is a magnetic flux density at the i th measurement sequence SQi (i.e. a corresponding phase i) corresponding to the detection value Si in one period, a and b are constants, tt is the time interval between the two pi/2 pulses (free precession time), and Gamma is a gyromagnetic ratio (constant). It should be noted that the constants a and b are the largest and the smallest values when BMi or tt is changed, and can be determined by measuring Si while changing tt under a condition of a known and constant BMi in an experiment, for example. In addition, the constant a may be derived as the detection light intensity when B=0.

The following part explains a behavior of the magnetic field measurement apparatus in this embodiment.

As shown in FIG. 2, for example, the measurement control unit 21 performs the DC physical field measurement sequence (here, Ramsey Pulse Sequence) SQ1, . . . , SQn a predetermined number n (n>1) of times (in a specific time span within one period (here in a whole range of one period)) per one period of the measurement target AC physical field (here, AC magnetic field), and the calculation unit 22 derives DC-physical-field measured values BMi corresponding to each DC physical field measurement sequence SQi on the basis of the detection values of the detecting device 5. Here, a length of one period of the measurement target AC physical field (here, AC magnetic field) is known.

The measurement control unit 21 and the calculation unit 22 perform these actions serially and repeatedly over plural periods PE1, . . . , PEm (m>1) of the measurement target AC physical field (here, AC magnetic field), and determines measured values [BM1(1), . . . , BMn(1)], . . . , [BM1(m), BMn(m)] for the plural periods PE1, . . . , PEm.

Subsequently, the calculation unit 22 calculates average values BMAi of the measured values [BM1(1), ..., BMn(1)], ..., [BM1(m), ..., BMn(m)] for the plural periods in accordance with the following formula, and thereby obtains this calculation result [BMA1, ..., BMAn] as the measurement result.

$$BMAi=(BMi(1)+ \ldots +BMi(m))/m$$

Here, in addition, the calculation unit 22 performs curve fitting to this measurement result [BMA1, ..., BMAn] and thereby derives a fitting curve (i.e. a measured waveform for the aforementioned one period).

Here, if a function type of the fitting curve is known (e.g. as sine wave), then for example, an optimal value of a parameter in the function type is derived on the basis of the aforementioned measurement result using a least squares method or the like, and thereby a function of the fitting curve is obtained. Contrarily, if a function type of the fitting curve is unknown, then for example, interpolation (or interpolation and extrapolation) is performed on the basis of the aforementioned measurement result using a predetermined method, and thereby a function of the fitting curve is obtained.

Further, the calculation unit 22 derives a measurement result of a largest amplitude of the measurement target AC physical field on the basis of the fitting curve derived as mentioned. For example, as shown in FIG. 2, a measurement value (estimated value) of the largest amplitude Bac is obtained of the measurement target AC magnetic field that is a sine wave.

Here explained is a Ramsey Pulse Sequence performed as each DC physical field measurement sequence SQi.

In one Ramsey Pulse Sequence, for example, as shown in FIG. 3, the measurement control unit 21 (a) firstly causes the irradiating device 4 to irradiate the magnetic resonance member 1 with excitation light of a predetermined wavelength and thereby unifies statuses of electron spins of the magnetic resonance member 1; (b) subsequently causes the coil 2 and the high frequency power supply 3 to apply a microwave magnetic field of the first pi/2 pulse; (c) afterward causes the coil 2 and the high frequency power supply 3 to apply a microwave magnetic field of the second pi/2 pulse when the predetermined time interval tt elapsed; and (d) causes the irradiating device 4 to irradiate the magnetic resonance member 1 with measurement light for projection measurement, causes the detecting device 5 to receive fluorescence emitted by the magnetic resonance member 1 and detects a light intensity of the fluorescence (a detection light intensity).

It should be noted that during the time interval tt, a direction of the electron spin is changed in direct proportion to a time integral of a magnetic flux density of an external magnetic field (here, the measurement target AC magnetic field), and therefore, the magnetic flux density of the external magnetic field (here, the measurement target AC magnetic field) can be derived from the detection light intensity.

Further, a time width tw of the pi/2 pulse is set as a time length that rotates the electron spin by pi/2 (about a few tens of nano seconds), and is predetermined from a period of a Rabi oscillation of the magnetic resonance member 1, or the like. Furthermore, for example, an irradiation time length of the excitation light and an irradiation time length of the measurement light are in a range from about a few micro seconds to about a few tens of micro seconds. Furthermore, for example, the aforementioned time interval is set to be equal to or shorter than a few hundreds of micro seconds. Furthermore, shorter time intervals are better between the excitation light irradiation and the first pi/2 pulse and between the second pi/2 pulse and the measurement light irradiation, respectively.

In this embodiment, as shown in FIG. 3, in one period of the measurement target AC magnetic field, Ramsey Pulse Sequences (DC physical field measurement sequences SQi) are performed serially. In FIG. 3, the irradiation of the measurement light in a certain measurement sequence SQi and the irradiation of the excitation light in the next measurement sequence SQ(i+1) are separately performed, but the both may be continuously performed.

Here, in a certain period PEj of the measurement target AC magnetic field, the i th measurement sequence SQi is performed at a phase Pi (that may be an unknown phase), and in the next period PE(j+1), the i th measurement sequence SQi is performed at the same phase Pi as well.

The measurement result obtained as mentioned may be stored as data into a storage device (not shown), may be transmitted as data to an external device, and/or may be displayed as data on a display device.

Further, for example, a length of the aforementioned one measurement sequence SQi is set to be equal to or shorter than a half period of the measurement target AC physical field, and a low frequency AC physical field, for example, having a frequency equal to or less than about 1 kHz (in particular, equal to or less than about 100 Hz) is considered as the measurement target.

It should be noted that in the aforementioned Spin Echo Pulse Sequence, if a transverse relaxation time T2 of an electron spin is about one milli second and the measurement target AC magnetic field includes a frequency component of about 1 kHz or less, in general, accurate measurement of its magnetic field density is hardly performed; but contrarily in this embodiment, in such a case, even if the measurement target AC magnetic field includes a frequency component of about 1 kHz or less, the measurement of the physical field is properly performed.

As mentioned, in the aforementioned embodiment, the magnetic resonance member 1 is a member that is arranged in a measurement target AC physical field, and in which a quantum operation can be performed in a specific quantum system. The coil 2 applies a magnetic field of a microwave to the magnetic resonance member 1. The high frequency power supply 3 causes the coil 2 to conduct a current of the microwave. In a DC physical field measurement sequence, the irradiating device 4 irradiates the magnetic resonance member 1 with light, and the detecting device 5 detects from the magnetic resonance member a physical phenomenon corresponding to the measurement target AC physical field. Further, the measurement control unit 21 performs the DC physical field measurement sequence a predetermined plural times, and in each of the plural times of the DC physical field measurement sequence, (a) controls the high frequency power supply 3 and the irradiating device 4, and (b) determines a detection value of the physical phenomenon detected by the detecting device 5. The calculation unit 22 calculates a measurement result for a specific time span (here, for one period) of the measurement target AC physical field on the basis of the detection values corresponding to the plural times of the DC physical field measurement sequence.

Consequently, a long period physical field such as AC magnetic field is accurately measured by means of a quantum operation in a specific quantum system in the magnetic resonance member 1. Specifically, the favorable sensitivity H is obtained in a low frequency range as mentioned, and therefore, measured values of a physical field as the measurement target are accurately obtained.

Further, as mentioned, if the aforementioned plural times of the DC physical field measurement sequence are uniformly performed (i.e. the time interval tt in the DC physical field measurement sequence and the time interval between the DC physical field measurement sequences are set to be constant regardless of a phase of the measurement target AC physical field), the aforementioned plural times of the DC physical field measurement sequence may be performed without synchronization between the aforementioned plural times of the DC physical field measurement sequence and the measurement target AC physical field. It should be noted that Spin Echo Pulse Sequence requires such synchronization with the measurement target AC physical field.

Further, it should be understood that various changes and modifications to the embodiments described herein will be apparent to those skilled in the art. Such changes and modifications may be made without departing from the spirit and scope of the present subject matter and without diminishing its intended advantages. It is therefore intended that such changes and modifications be covered by the appended claims.

For example, in the aforementioned embodiment, as an example, a waveform of the measurement target AC magnetic field is assumed as a sine wave. Alternatively, when a period of the measurement target AC magnetic field is known, a waveform of the measurement target AC magnetic field may be another waveform (e.g. triangle wave, sawtooth wave, square wave, synthesized wave of plural waveforms, or the like). Further, the measurement target AC magnetic field may include a DC component. Furthermore, this is applicable even if the measurement target is a physical field other than an AC magnetic field.

Furthermore, in the aforementioned embodiment, the time interval tt in the DC physical field measurement sequence may be changed correspondingly to a phase in one period of the measurement target AC physical field. In such a case, if a known external AC signal synchronizes with the measurement target AC physical field, and the external AC signal is available, then a phase of the measurement target AC physical field may be determined on the basis of a phase of the external AC signal. For example, if the measurement target AC physical field is generated by a physical phenomenon due to the external AC signal, then the measurement target AC physical field may synchronize with the external AC signal. Alternatively, for example, such that the plural times of the aforementioned DC physical field measurement sequence are repeatedly performed with the constant time interval tt, and a waveform or the like is determined from a measurement result thereof, a phase of the measurement target AC physical field may be determined from the waveform or the like.

Furthermore, in the aforementioned embodiment, the measurement result is obtained for one period as an example of the specific time span. Alternatively, the measurement result for periods longer than one period (e.g. for two periods) may be obtained. Furthermore, in the aforementioned embodiment, the measurement result may be obtained for a time span shorter than one period (i.e. a specific phase range). In such a case, for example, in each period in the aforementioned plural periods, only detection values corresponding to this time span may be acquired and only measured values corresponding to this time span may be derived. However, it is favorable to set this time span as one period.

Furthermore, in the aforementioned embodiment, if the measurement target physical field has a large intensity (i.e. a large amplitude), and an election spin of a color center in the magnetic resonance member 1 is rotated by one round (i.e. 2 pi) or more, then the detection value, the measured value, and the measurement result are obtained correspondingly to an angle that is a remainder obtained by dividing an actual rotation angle of the electron spin by 2 pi. Therefore, in such a case, the calculation unit 22 may estimate the actual rotation angle of the electron spin from the aforementioned detection value, the aforementioned measured value, and the aforementioned measurement result, and thereby convert the aforementioned detection value, the aforementioned measured value, and the aforementioned measurement result to values corresponding to the actual rotation angle of the electron spin; and may perform the aforementioned curve fitting on the basis of the values obtained by this conversion. In this process, without this conversion, the aforementioned curve fitting may be performed using the fitting function that takes the 2-pi-spin-phase-period.

Furthermore, in the aforementioned embodiment, if all of the measured values $BMi(1), \ldots, BMi(m)$ of the plural (m) periods are derived for a phase i, then an average value $BMAi$ of the m measured values $BMi(1), \ldots, BMi(m)$ for the phase i is derived as a part corresponding to the phase i in the measurement result. However, if a part is lacked in the m measured values $BMi(1), \ldots, BMi(m)$ for the phase i and the only remaining part in $BMi(1), \ldots, BMi(m)$ are derived, then an average value of the remaining part is calculated as the aforementioned average value $BMAi$. Specifically, for example, if the L th measured value (i.e. of the L th period) is not obtained in the measured values $BMi(1), \ldots, BMi(L-1), BMi(L), BMi(L+1), \ldots, BMi(m)$ ($1<L-1$, L, and $L+1<m$) (for example, if the corresponding detection value is not obtained as a proper value, if the L th measurement is not performed, or the like), then an average value of the remaining (L−1) measured values is calculated as the aforementioned average value $BMAi$ in accordance with the following formula. It should be noted that if two or more measured values are not obtained, then the average value $BMAi$ is derived in the same manner.

$$BMAi = (BMi(1) + \ldots + BMi(L-1) + BMi(L+1) + \ldots + BMi(m))/(m-1)$$

Furthermore, in the aforementioned embodiment, for obtaining the measurement result, the averaging at each phase is performed on plural sets of the measured values for a specific time span per period over the plural periods. Alternatively, if the time-wise averaging is not needed, then one set of the measured values for a specific time span over one period may be derived as the measurement result (without the averaging).

INDUSTRIAL APPLICABILITY

For example, the present invention is applicable to a magnetic measurement apparatus and a magnetic measurement method.

The invention claimed is:
1. A measurement apparatus, comprising:
a magnetic resonance member arranged in a measurement target AC physical field, and in which a quantum operation can be performed in a specific quantum system;
a coil that applies a magnetic field of a microwave to the magnetic resonance member;
a high frequency power supply that causes the coil to conduct a current of the microwave;

an irradiating device that irradiates the magnetic resonance member with light in a DC physical field measurement sequence;

a detecting device that detects from the magnetic resonance member a physical phenomenon corresponding to the measurement target AC physical field in the DC physical field measurement sequence;

a measurement control unit that performs the DC physical field measurement sequence a predetermined plural times, and in each of the plural times of the DC physical field measurement sequence, (a) controls the high frequency power supply and the irradiating device, and (b) determines a detection value of the physical phenomenon detected by the detecting device;

a calculation unit that calculates a measurement result for a specific time span of the measurement target AC physical field on the basis of the detection values corresponding to the plural times of the DC physical field measurement sequence;

wherein the calculation unit performs the DC physical field measurement sequence the predetermined plural times every period of the measurement target AC physical field, and calculates averages of the measurement results for the specific time span that are obtained over plural periods of the measurement target AC physical field, and thereby decreases noise in the measurement result for the specific time span; and the number of the measurement results for the specific time span is same as the number of plural periods.

2. The measurement apparatus according to claim 1, wherein the magnetic resonance member includes a color center of which an electron spin quantum operation can be performed;

the DC physical field measurement sequence includes two pill pulses of the microwave;

the physical phenomenon corresponds to a phase change of an electron spin of the color center in Rabi oscillation, due to a free precession motion during a time interval between the two pi/2 pluses; and the time interval between the two pi/2 pluses is (a) set correspondingly to an effective transverse relaxation time of the magnetic resonance member, and (b) set such that a frequency of the measurement target AC physical field is included in an effective-sensitivity frequency range Obtained by this time interval.

3. A measurement method, comprising the steps of:

(a) performing a DC physical field measurement sequence a predetermined plural times, and in each of the plural times of the DC physical field measurement sequence, detecting a physical phenomenon corresponding to a measurement target AC physical field, and determining a detection value of the physical phenomenon; wherein the DC physical field measurement sequence is performed the predetermined plural times every period of the measurement target AC physical field; and (b) calculating (1) a measurement result for a specific time span of the measurement target AC physical field on the basis of the detection values corresponding to the plural times of the DC physical field measurement sequence and (2) averages of the measurement results for the specific time span that are obtained over plural periods of the measurement target AC physical field, and thereby decreases noise in the measurement result for the specific time span; and thereby decreases noise in the measurement result for the specific time span; wherein the number of the measurement results for the specific time span is same as the number of plural periods; and wherein the DC physical field measurement sequence is performed using a magnetic resonance member arranged in the measurement target AC physical field, and in which a quantum operation can be performed in a specific quantum system; a coil that applies a magnetic field of a microwave to the magnetic resonance member; a high frequency power supply that causes the coil to conduct a current of the microwave; an irradiating device that irradiates the magnetic resonance member with light in a DC physical field measurement sequence; and a detecting device that detects from the magnetic resonance member a physical phenomenon corresponding to the measurement target AC physical field in the DC physical field measurement sequence.

* * * * *